(12) United States Patent
Hsiao et al.

(10) Patent No.: US 9,263,407 B2
(45) Date of Patent: Feb. 16, 2016

(54) METHOD FOR MANUFACTURING A PLURALITY OF METAL POSTS

(71) Applicant: Taiwan Semiconductor Manufacturing Company, Ltd., Hsin-Chu (TW)

(72) Inventors: Yi-Li Hsiao, Hsin-Chu (TW); Su-Chun Yang, Hsin-Chu (TW); Chih-Hang Tung, Hsin-Chu (TW); Da-Yuan Shih, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 13/926,905

(22) Filed: Jun. 25, 2013

(65) Prior Publication Data

US 2014/0262470 A1 Sep. 18, 2014

Related U.S. Application Data

(60) Provisional application No. 61/798,553, filed on Mar. 15, 2013.

(51) Int. Cl.
*H01R 43/00* (2006.01)
*H01L 23/00* (2006.01)
(Continued)

(52) U.S. Cl.
CPC ............... *H01L 24/13* (2013.01); *H01L 24/11* (2013.01); *H01L 24/43* (2013.01); *H01L 24/45* (2013.01); *H01L 24/742* (2013.01); *H01L 24/745* (2013.01); *H01L 23/49811* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/1134* (2013.01); *H01L 2224/13016* (2013.01); *H01L 2224/13147* (2013.01); *H01L 2224/13562* (2013.01); *H01L 2224/13578* (2013.01); *H01L 2224/13644* (2013.01); *H01L 2224/13655* (2013.01); *H01L 2224/43125* (2013.01); *H01L 2224/4556* (2013.01);
(Continued)

(58) Field of Classification Search
CPC . H01R 43/18; Y10S 439/907; Y10S 439/931; Y10T 29/49204; Y10T 29/49121; Y10T 29/49208; Y10T 29/49222; Y10T 29/49224
USPC .................. 29/605, 606, 843, 874, 876, 878, 29/883–885; 257/737, 778, E21.508, 257/E29.109; 439/66, 83, 841, 876, 885
See application file for complete search history.

(56) References Cited

U.S. PATENT DOCUMENTS 4,164,726 A * 8/1979 Weibe ........................... 337/215
6,483,195 B1 * 11/2002 Aoki et al. .................... 257/778
(Continued)

*Primary Examiner* — Thiem Phan
(74) *Attorney, Agent, or Firm* — Slater & Matsil, L.L.P.

(57) ABSTRACT

A method includes forming a plurality of metal posts. The plurality of metal posts is interconnected to form a metal-post row by weak portions between neighboring ones of the plurality of metal posts. The weak portions include a same metal as the plurality of metal posts. A majority of each of the plurality of metal posts is separated from respective neighboring ones of the plurality of metal posts. An end portion of each of the plurality of metal posts is plated with a metal. The plurality of metal posts is disposed into a metal post-storage. The method further includes retrieving one of the metal posts from a metal-post storage, and bonding the one of the metal posts on a metal pad.

7 Claims, 11 Drawing Sheets

(51) Int. Cl.
*H05K 3/40* (2006.01)
*H01L 23/498* (2006.01)

(52) U.S. Cl.
CPC .......... *H01L2224/45147* (2013.01); *H01L 2224/45578* (2013.01); *H01L 2224/45644* (2013.01); *H01L 2224/45655* (2013.01); *H01L 2224/48824* (2013.01); *H01L 2224/48839* (2013.01); *H01L 2224/48844* (2013.01); *H01L 2224/48847* (2013.01); *H01L 2224/48855* (2013.01); *H01L 2224/48864* (2013.01); *H01L 2224/742* (2013.01); *H01L 2224/745* (2013.01); *H05K 3/4015* (2013.01); *H05K 2201/10318* (2013.01); *Y10T 29/49208* (2015.01)

(56) References Cited

U.S. PATENT DOCUMENTS

| 7,010,846 | B2 * | 3/2006 | Nakamura | 29/596 |
| 7,874,880 | B2 * | 1/2011 | Fedde et al. | 439/841 |
| 8,479,390 | B2 * | 7/2013 | Ohnishi et al. | 29/878 |

\* cited by examiner

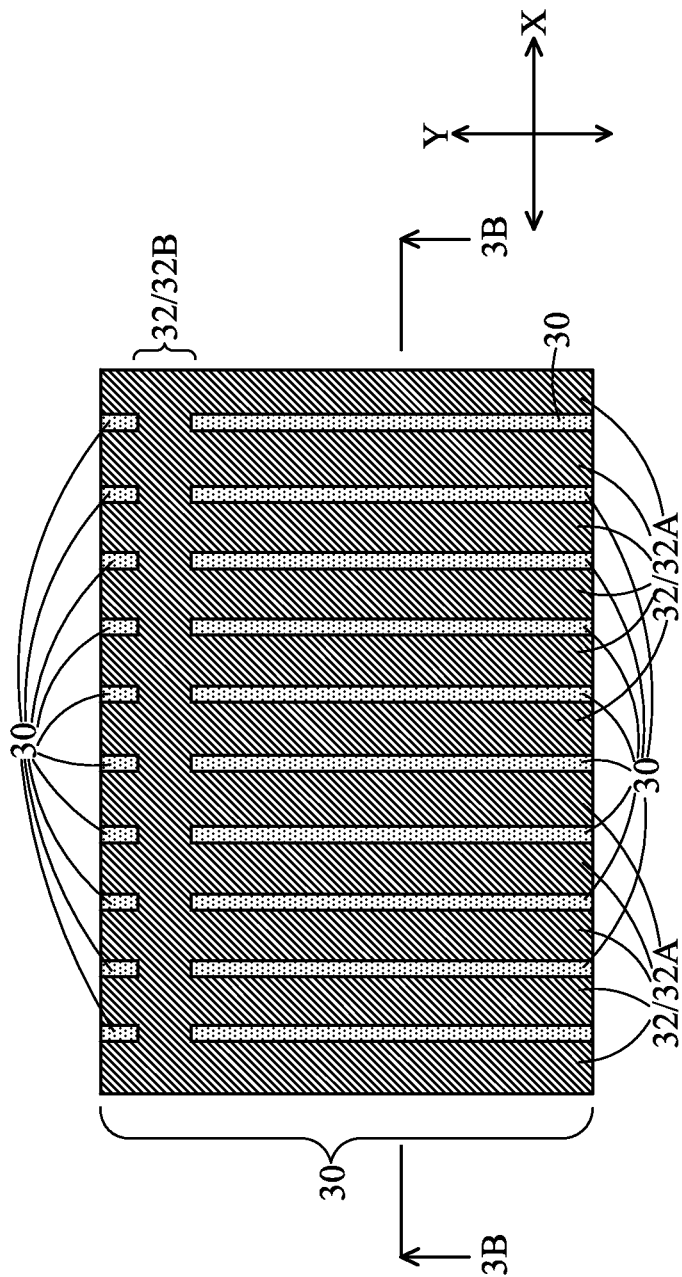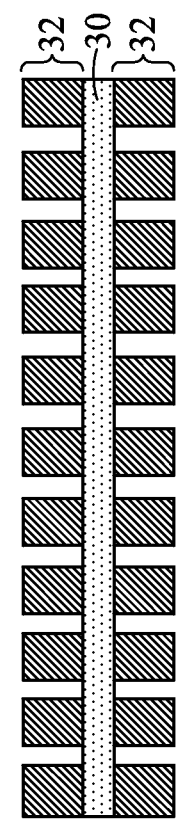
Fig. 3A
Fig. 3B

METHOD FOR MANUFACTURING A PLURALITY OF METAL POSTS

This application claims the benefit of U.S. Provisional Application No. 61/798,553, filed on Mar. 15, 2013, and entitled "Metal Post Bonding Using Pre-Fabricated Metal Posts," which application is hereby incorporated herein by reference.

BACKGROUND

In the bonding of integrated circuits, solder regions, copper pillars, or the like, are used for bonding device dies to package substrates. The dies and the package substrates, however, suffer from warpage. In addition, the packaging process often involves thermal processes, in which the packages are heated. Since the packages include different materials that have different Coefficients of Thermal Expansion (CTE), stresses are applied on the bonded packages. For example, the package substrates typically have greater CTEs than the device dies. This results in stresses to be applied to the solder regions. The stresses are also imparted to the device dies through the solder regions, causing dielectric delamination in the device dies.

One way of solving this problem is to use metal posts as the interconnection for the device dies and the package substrates. The metal posts are longer than typical solder regions and metal pillars, and hence may absorb the stress. The metal posts were formed by bonding a metal wire on one of the device dies and the package substrates, and then cutting the metal wire. The part of the metal wire left to connect to the bond ball is hence the metal post. This process, however, has a very low throughput. In addition, the uniformity in the lengths of the metal wires is difficult to control.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 3A through 4C illustrate exemplary formation processes for forming the metal posts in accordance with some exemplary embodiments;

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A metal post fabrication process and the method of bonding the pre-fabricated metal posts on package components are provided in accordance with various exemplary embodiments. The intermediate stages of forming the metal posts and bonding the same are illustrated. The variations of the embodiments are discussed. Throughout the various views and illustrative embodiments, like reference numbers are used to designate like elements.

Figure 1:
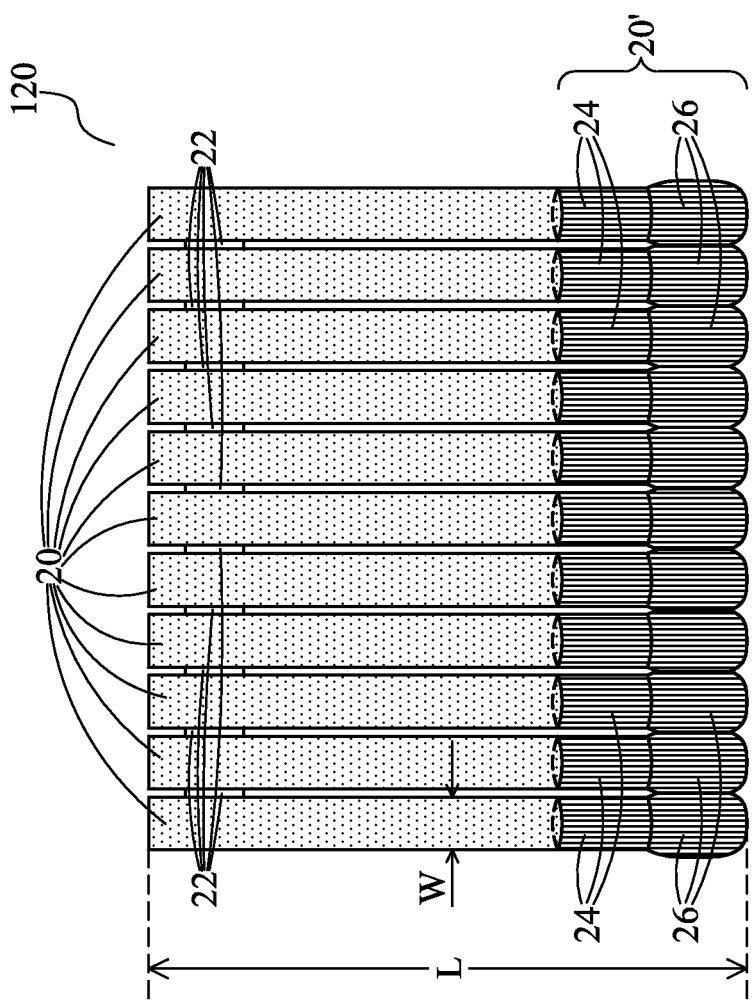
FIGS. 1 and 2 are perspective views of meta posts in accordance with some exemplary embodiments.

FIG. 1 illustrates a perspective view of a plurality of metal posts 20. In accordance with some embodiments, metal posts 20 comprises copper. In alternative embodiments, metal posts 20 comprise aluminum, tungsten, tin, or the like. Metal posts 20 may be used for forming bonding wires in the packages of integrated circuits, and may be used for bonding two package components such as device dies, interposers, package substrates, Printed Circuit Boards (PCBs) together. Alternatively, metal posts 20 are used as probe pins for probing integrated circuits. The lengths and widths of metal posts 20 are hence determined according to their usage. In some embodiments, the length L of metal posts 20 ranges from about 60 μm to about 500 μm, and width W of metal posts 20 ranges from about 15 μm to about 100 μm. Metal posts 20 form row 120 in the illustrated exemplary embodiments.

Most portions of each of metal posts 20 are disconnected from, and may be physically separated from, neighboring metal posts 20. In some embodiments, small weak portions 22 remain between the neighboring metal posts 20, and interconnect metal posts 20 as row 120. Portions 22 thus act as the interconnecting portions for metal posts 20. In some embodiments, as shown in FIG. 1, two neighboring metal posts 20 are interconnected through one weak portion 22. In alternative embodiments, two neighboring metal posts 20 are interconnected through two or more weak portions 22. Weak portions 22 may be thinner, and hence are weaker, than the majority part of each of metal posts 20, and hence can be broken as desired without damaging metal posts 20.

In some embodiments, end portions 20' of metal posts 20 are plated with a metallic material that may improve the oxidation resistance and the bondability of metal posts 20. In accordance with some embodiments, nickel layer 24 is plated, for example, on an end portion of each of metal posts 20. In addition, gold layer 26 may be plated on nickel layer 24. In some embodiments, gold layer 26 covers a part, and not an entirety, of the nickel layer 24 in the same metal post 20. Nickel layer 24 and gold layer 26 may be plated using electroless plating. Alternatively, Electroless Nickel Immersion Gold (ENIG), Electroless Nickel Electroless Palladium (ENEP), Electroless Nickel Electroless Palladium Immersion Gold (ENEPIG), Immersion Tin (ImSn), Immersion Silver (ImAg), Immersion Gold (ImAu), or the like, may be performed for plating end portions 20' of metal posts 20. In some embodiments, one end of each metal posts 20 is plated, while the other end is not plated. Although both ends may be plated in alternative embodiments. In other embodiments, both ends are not plated. In yet alternative embodiments, metal poste 20 is plated with a blanket surface protection layer, which may have same materials and structures as discussed. Although not illustrated in detail, Nickel layer 24 and gold layer 26 on neighboring metal posts 20 may be separated from each other.

Figure 2:
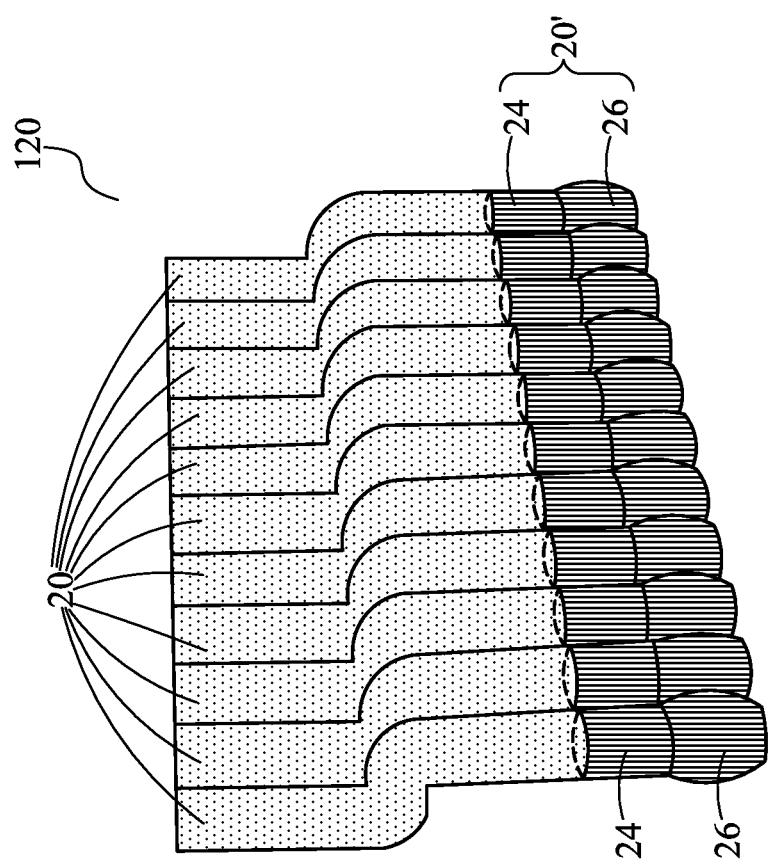

FIG. 2 illustrate metal posts 20 in accordance with alternative embodiments. These embodiments are similar to the embodiments in FIG. 1, except that metal posts 20 are bent to form micro-springs. For example, metal posts 20 may have the N-shape (which has a zig-zag pattern) as illustrated in FIG. 2. The bent metal posts 20 are adapted to absorb stress since their shapes can be changed easily when applied under stress.

FIGS. 3A through 4C illustrate exemplary processes for forming metal posts 20. FIGS. 3A and 3B illustrate a top view and a cross-sectional view, respectively, in the formation of metal posts 20 in accordance with some embodiments. Referring to FIG. 3A, metal film 30 is provided. Metal film 30 comprises the same material as the base material of metal posts 20, and may comprise copper, aluminum, tungsten, tin, or alloys thereof. Photo resist 32 is formed on opposite sides of metal film 30, and are patterned. The patterns of photo resist 32 on the opposite sides of metal film 30 may overlap with each other, as shown in FIG. 3B, which is a cross-sectional view obtained from the plane crossing line 3A-3A in FIG. 3A. In some embodiments, as shown in FIG. 3A. Photo resist 32 includes a plurality of strips 32A having lengthwise directions extending in a first direction (the Y direction in FIG. 3A), with spaces separating the plurality of strips 32A from each other. In addition, photo resist 32 further includes strip portion 32B extending in the X direction, wherein photo resist portion 32B interconnects photo resist portions 32A. Strip portions 32A are used to separate the major parts of metal posts 20 from each other. Strip portion 32B is used to form weak portions 22 (FIG. 1) in the subsequent process.

Metal film 30 and photo resist 32 thereon are then emerged into an etching solution (not shown) to etch metal film 30. As a result, the metal posts 20 as shown in FIG. 1 are formed. In the etching of metal film 30, since the etching is isotropic, the cross-sectional view shapes of metal posts 20 may have rounded corners. Due to the protection of photo resist portion 32B as in FIG. 3A, weak portions 22 (FIG. 2) are formed. By properly adjusting the size of strip portion 32B (FIG. 3A), the portions of metal film 30 covered by strip portion 32B are partially etched due to the isotropic etching, but are not completely removed. After metal film 30 and photo resist 32 are taken out of the etching solution, photo resist 32 is removed. In a subsequent step, layers 24 and 26 (FIG. 1) are formed on metal posts 20. In the embodiments that bent metal posts 20 (FIG. 2) are to be formed, a mechanical bending process is performed to bend metal posts 20 to a desirable shape.

Figure 4A:
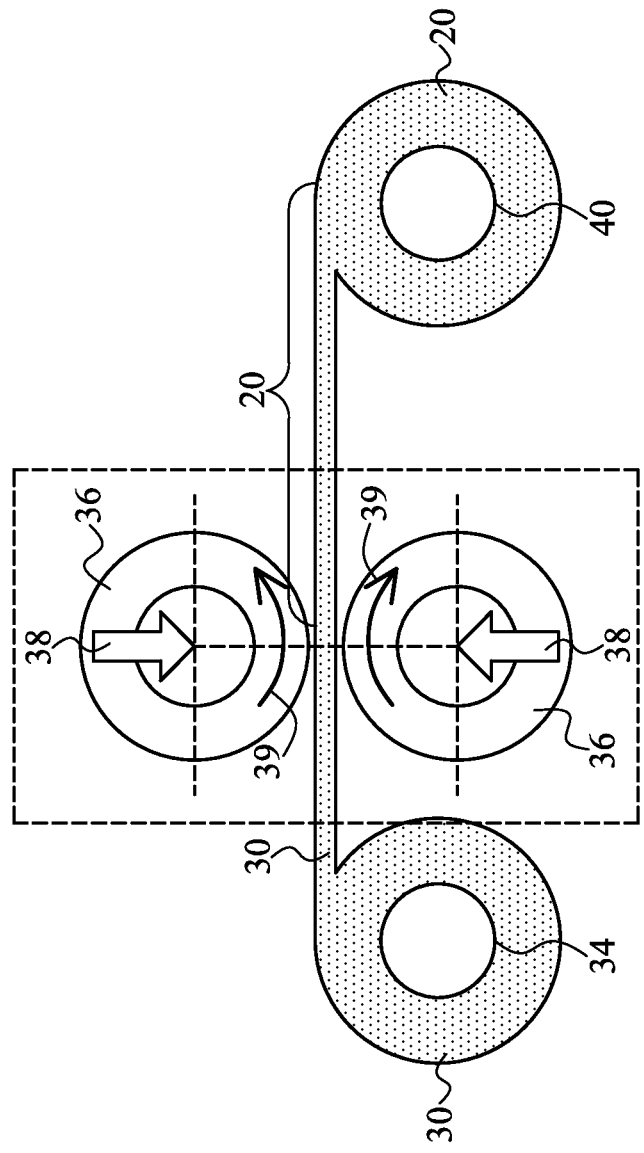
Figure 4B:
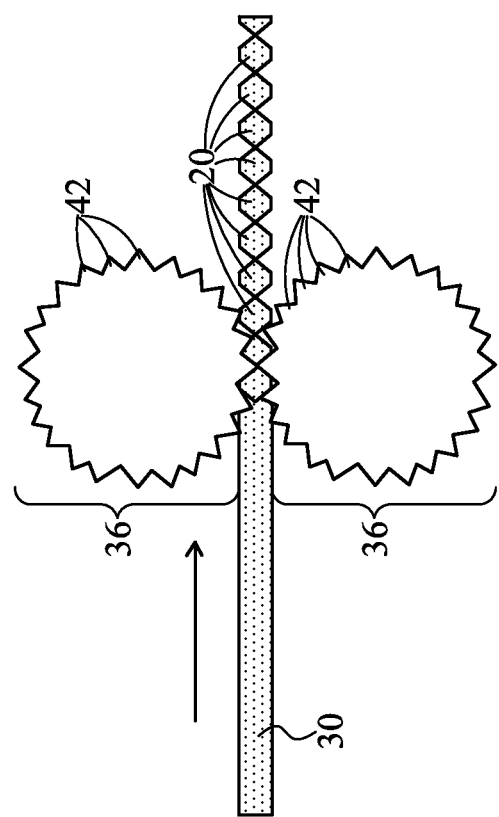
Figure 4C:
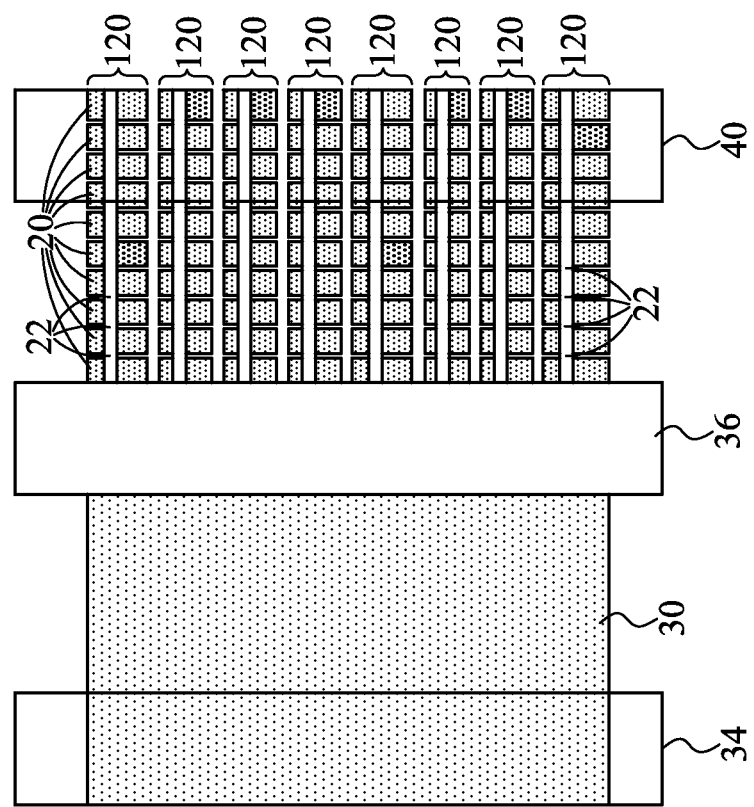

FIGS. 4A, 4B, and 4C illustrate the cross-sectional views and a top view in the formation of metal posts 20 in accordance with alternative embodiments. As shown in FIG. 4A, which is a cross-sectional view, metal film 30 is rolled on spool 34 first. Although not visible in FIG. 4A, metal film 30 may be a long metal strip. Two rollers 36 are placed against each other, with metal film 30 passing therebetween. Rollers 36 rotate in the illustrated direction 39, so that metal film 30 is molded. The molded metal film 30 is pulled toward, and is rolled on, spool 40. Arrows 38 represent that forces are applied on rollers 36 to mold metal film 30. Metal film 30, after being molded by rollers 36, form metal posts 20, which are also schematically shown in FIG. 1. Metal posts 20, although having the majority separated from each other, are still attached to form a long metal-post row 120 (FIG. 4C) through weak portions 22, as also shown in FIG. 1. The rows 120 formed of interconnected metal posts 20 are rolled on spool 40.

FIG. 4B illustrates a magnified view of a portion of the system shown in FIG. 4A. In accordance with some embodiments, rollers 36 have teeth 42, whose shapes are designed according to the desirable shapes of the resulting metal posts 20. Some parts of teeth 42 from the opposite rollers 36 may have a small space (not shown) therebetween, resulting in weak portions 22 (FIG. 1). Some other parts of teeth 42 from the opposite rollers 36 are in contact with each other, and hence the majority parts of neighboring metal posts 20 are separated from each other.

FIG. 4C illustrates a top view of the system shown in FIG. 4A. As shown in FIG. 4A, after metal film 30 passes through rollers 36, a plurality of rows 120 of metal posts 20 is formed simultaneously, wherein the total number of simultaneously formed rows 120 may range from tens to thousands. Accordingly, the formation of metal posts 20 is highly efficient.

In yet other embodiments, metal posts 20 may be formed using other methods such as electroforming.

Figure 5:
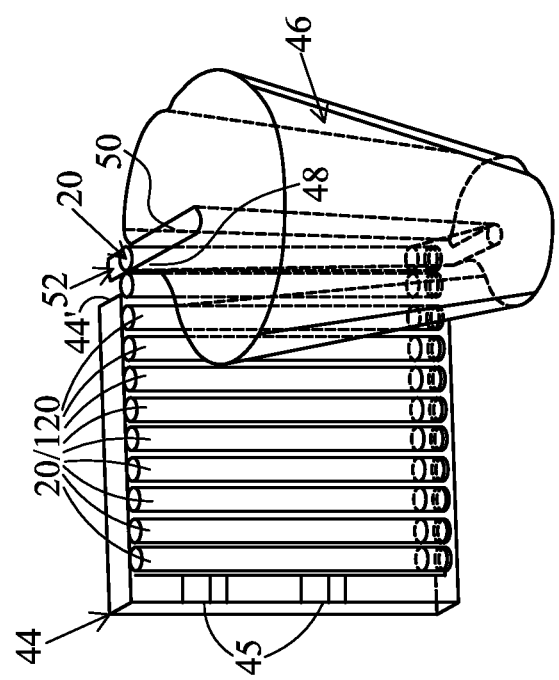
FIGS. 5 and 6 illustrate the retrieval of straight metal posts from a metal-post storage in accordance with some exemplary embodiments.
Figure 6:
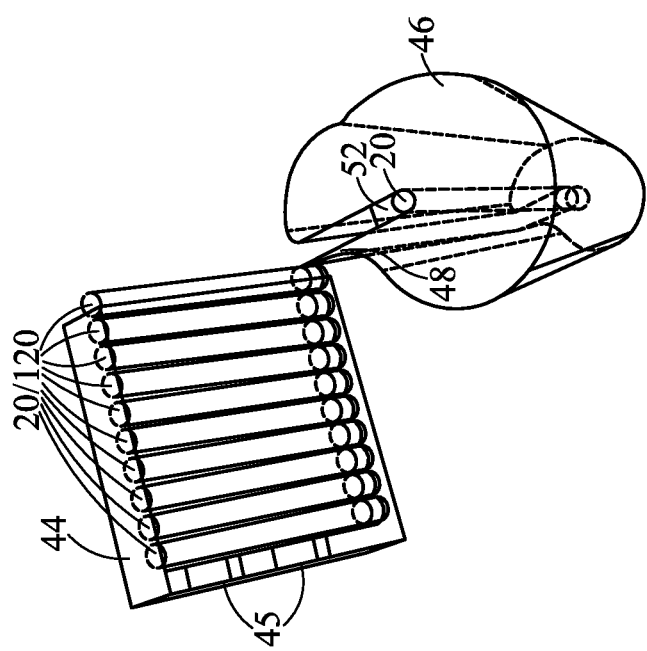

Metal-post rows 120, as shown in FIGS. 1 and 4C, may be disposed into a metal-post storage for easy retrieval. The metal-post storage may have different designs, as long as multiple metal posts 20 can be stored, and can be easily retrieved efficiently. In some exemplary embodiments, the metal posts 20 are stored in a metal-post magazine. For example, FIGS. 5 and 6 illustrate exemplary embodiments for storing metal posts 20 in metal-post magazine 44, and retrieving metal posts 20 one by one. Referring to FIG. 5, metal-post row 120 is placed in metal-post magazine 44, whose size and shape are designed to fit the size and the shape of metal-post row 120 and metal posts 20. Metal-post magazine 44 may include feeding mechanism 45, which is used to push metal-post row 120 forward when the front metal post 20 is taken away. Feeding mechanism 45 may include, for example, springs. The front end 44' of metal-post magazine 44 is an open end, and metal posts 20 are retrieved from front end 44'.

In alternative embodiments, instead of being placed in a straight metal-post magazine, metal posts 20 may be rolled, for example, similar to the rolling on spool 40 in FIG. 4A, and the rolled metal post 20 may be placed in a magazine that fits the shape of the respective roll. Also, the respective magazine has an open end, so that metal posts 20 may be retrieved.

As shown in FIG. 5, in an exemplary retrieving process, capillary 46 is used to retrieve metal post 20. Capillary 46 includes cutting edge 48, which is sharp enough to cut through weak portion 22 (FIG. 1) when capillary 46 is moved against metal-post row 120. As a result, the very front metal post 20 in metal-post row 120 is separated from metal-post row 120. Capillary 46 includes slot 50, which has a width substantially equal to, and slightly greater than, the widths of metal posts 20. In accordance with some embodiments, capillary 46, when retrieving the front metal post 20, may apply a force on the front metal post 20 to pull metal row 120 forward (toward the right direction in FIG. 5). In addition, feeding mechanism 45 also provides a pushing force. Accordingly, the second metal post 20 in row 120 is moved to the same position the front metal post 20 used to be, and becomes the front metal post after the preceding metal post 20 is retrieved. After being cut apart, metal post 20 is pushed into slot 50 by clamp 52, as shown in FIGS. 5 and 6. Next, as shown in FIG. 6, clamp 52 pushes metal post 20 toward the end of slot 50, and clamps metal post 20 in capillary 46. Capillary 46 may then be moved away from magazine 44.

Figure 8:
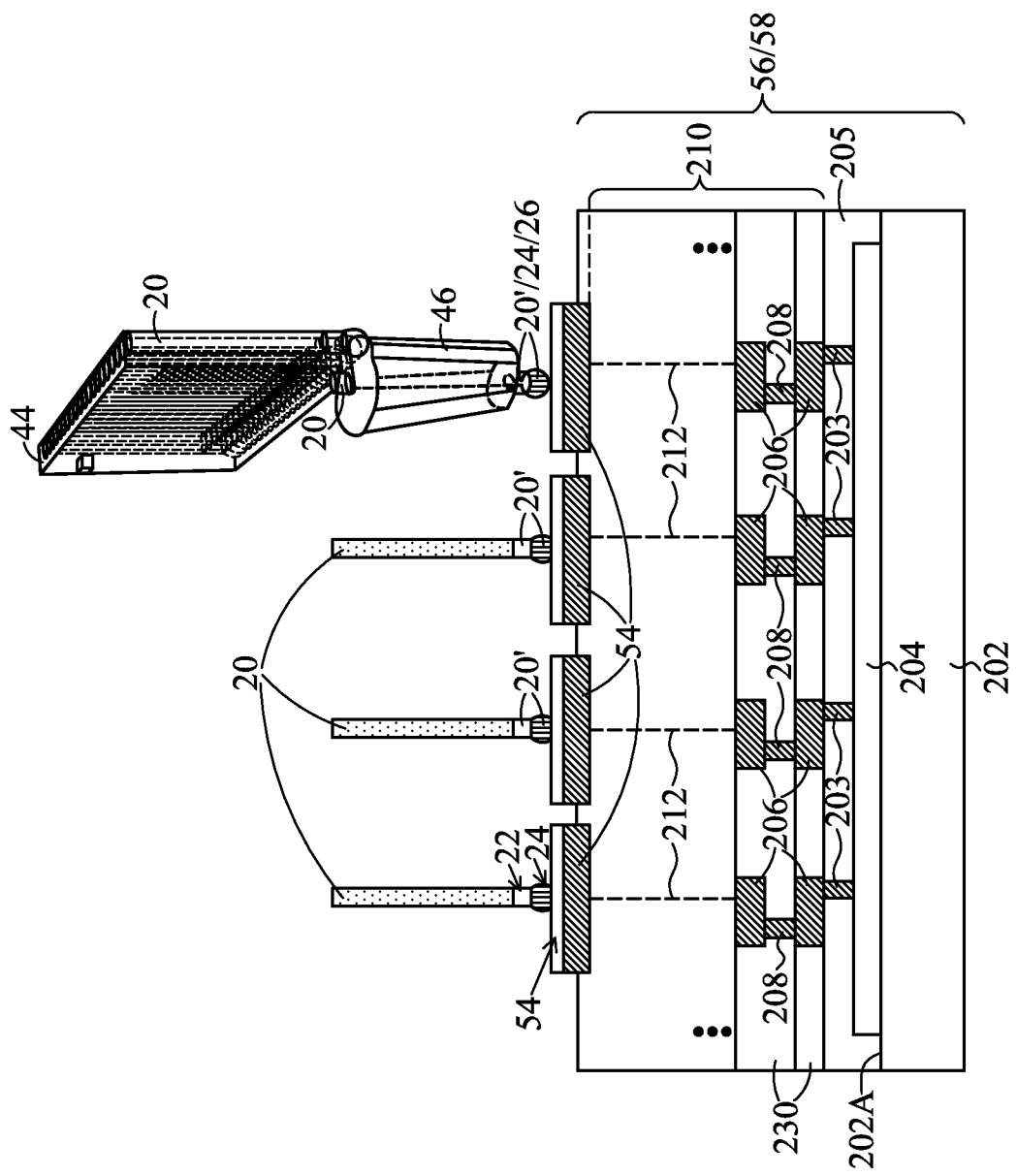
FIG. 8 illustrates the bonding of metal posts on metal pads in accordance with some exemplary embodiments.
Figure 9:
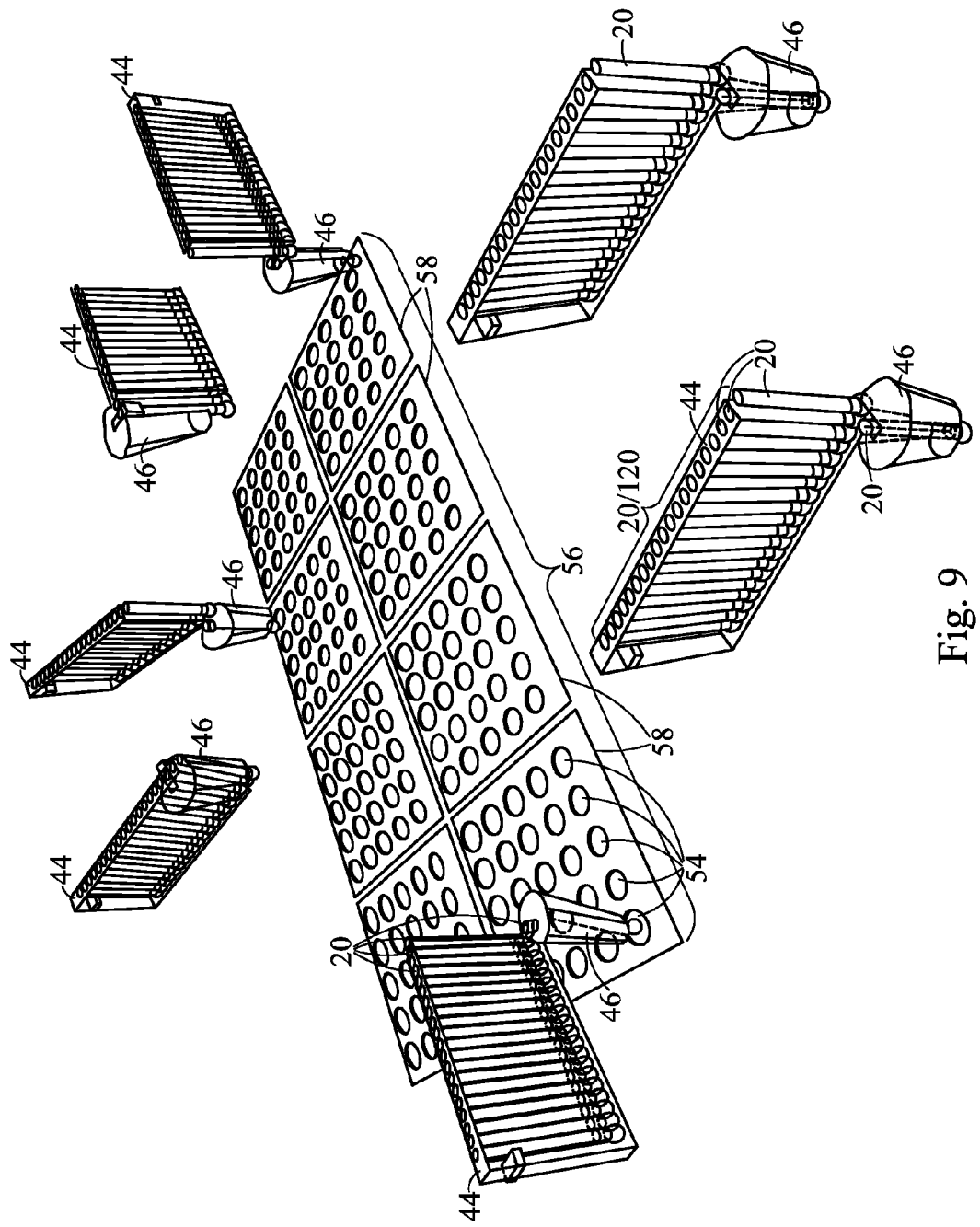
FIG. 9 illustrates the multi-capillary bonding in accordance with some exemplary embodiments.

After being clamped, metal post 20 has end 20' exposed out of the bottom of capillary 46, as shown in FIG. 8. Capillary 46 may then bond metal post 20 to metal pad 54, wherein during the bonding process, ultrasonic vibration is used to help the bonding. Metal pads 54 may be parts of package components 56 and 58, which are shown in FIG. 9. In some embodiments, since the ends 20' of metal posts 20 are plated with the metal (such as gold) that may easily form bonds with metal pad 54, the resulting bonds have good quality. Furthermore, the quality of the bond may be better than the bond formed by conventional bonding directly using the metal wire from a spool since the conventional wire ends of the wires cut from the metal wire were not improved by the plated layers. After the metal post 20 in capillary 46 is bonded, capillary 46 moves back to magazine 44 (FIG. 5) to retrieve the next metal post 20, and an additional bonding may be performed.

Figure 7:
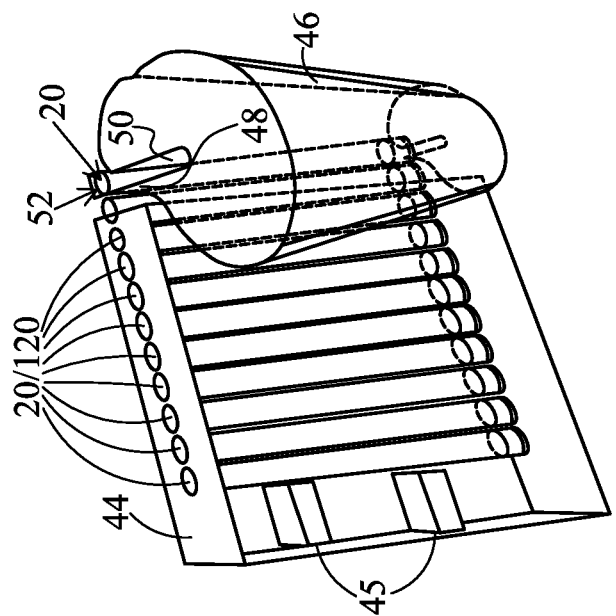
FIG. 7 illustrates the retrieval of bent metal posts from a metal-post storage in accordance with some exemplary embodiments.

FIG. 7 illustrates the storage and the retrieval of bent metal posts 20 (also refer to FIG. 2) in accordance with some embodiments. These embodiments are essentially the same as the embodiments in FIGS. 5 and 6, except that the shapes and the sizes of the inner spaces of magazine 44 and slot 50 in capillary 46 are designed to fit the shape and the size of the bent metal posts 20. For example, in the embodiments in FIG. 7, the inner spaces of magazine 44 and slot 50 are designed to have the N-shapes (referring to FIG. 2). The bonding of the bend metal posts 20 is essentially the same as shown in FIG. 8.

Referring to FIG. 8, an exemplary package component 58 is illustrated, and metal posts 20 are bonded onto package component 58. Package component 58 may be a part of package component 56, which is schematically illustrated in FIG. 9. In some embodiments, package component 56 (FIG. 9) is a wafer comprising a plurality of chips 58 therein, which may include active circuits including transistors. In alternative embodiments, package component 56 is an interposer wafer comprising a plurality of interposer chips 58 therein, which may not include active circuits. In yet alternative embodiments, package component 56 is a package substrates strip comprising a plurality of package substrates 58 therein, which may be laminated substrates or build-up substrates. In yet alternative embodiments, package component 56 is a probe card, with metal posts 20 bonded thereon to act as probes.

FIG. 8 illustrates a cross-sectional view of exemplary package component 58, which is a chip in accordance with some embodiments. Package component 58 includes semiconductor substrate 202, which may be a bulk silicon substrate or a silicon-on-insulator substrate. Alternatively, other semiconductor materials including group III, group IV, and/or group V elements may also be included in semiconductor substrate 202. Integrated circuit 204 is formed at surface 202A of semiconductor substrate 202. Integrated circuit 204 may include Complementary Metal-Oxide-Semiconductor (CMOS) devices therein. In alternative embodiments, substrate 202 is an interposer die, a package substrate, and/or the like. In the embodiments wherein package component 58 is an interposer die, package component 58 does not include active devices such as transistors therein. Package component 58 may include passive devices such as resistors and capacitors, or free from passive devices in some embodiments.

In the embodiments wherein package component 58 is a device die, package component 58 may further include Inter-Layer Dielectric (ILD) 205 over semiconductor substrate 202, and interconnect structure 210 over ILD 205. Contact plugs 203 are formed in ILD 205, and are electrically coupled to integrated circuit 204. Interconnect structure 210 includes dielectric layers 230, and metal lines 206 and vias 208 formed in dielectric layers 230. In some embodiments, dielectric layers 230 are formed of low-k dielectric materials. The dielectric constants (k values) of the low-k dielectric materials may be smaller than about 2.8, or smaller than about 2.5, for example. Metal lines 206 and vias 208 may be formed of copper, a copper alloy, or other metal-containing conductive materials. Metal lines 206 and vias 208 may be formed using single damascene and/or dual damascene processes.

Metal pads 54 are formed over interconnect structure 210, and may by electrically coupled to circuit 204 through metal lines 206 and vias 208. Dashed lines 212 are illustrated to represent the electrical coupling, which includes metal lines and vias. Metal pads 54 may be aluminum pads or aluminum-copper pads. For example, metal pads 54 may comprise between about 1 percent and about 100 percent aluminum (in which case metal pads 54 are aluminum pads), and less about 1 percent copper, for example. In some embodiments, metal pads 54 comprise copper, aluminum, nickel, palladium, gold, silver, or the like. Metal pads 54 may also have the structure of Electroless Nickel Immersion Gold (ENIG), Electroless Nickel Electroless Palladium (ENEP), Electroless Nickel Electroless Palladium Immersion Gold (ENEPIG), Immersion Tin (ImSn), Immersion Silver (ImAg), Immersion Gold (ImAu), or the like. With such structures, metal pads 54 have a good bonding to metal posts 20.

FIG. 9 illustrates the multi-capillary bonding of metal posts on package component 56. As shown in FIG. 9, a plurality of capillaries 46 may be used to bond metal posts 20 on package component 56 simultaneously. Each of the capillary 46 may be accompanied by a metal-post storage 44 to supply metal posts 20, although a plurality of capillaries 46 may share one metal-post storage 44. Accordingly, simultaneous bonding may be performed, and hence the throughput of the bonding process is improved.

In the embodiments of the present disclosure, the metal posts are pre-made using high-throughput processes. The bondability of the metal posts is also improved due to the formation of the plated layers. In addition, in the bonding of the metal posts, the bonder does not need to perform any time consuming cutting action (such as using electrical sparks) that is used in conventional processes. As a comparison, in conventional metal formation processes, a metal post is formed by bonding a metal wire on a metal pad, and then cutting the metal wire, for example, using electrical sparks. Accordingly, in the embodiments of the present disclosure, the apparatus for forming the electrical sparks are not needed, and the bonding apparatus is much smaller than conventional capillaries. This enables multiple capillaries to work on the same package component simultaneously. The throughput of the bond process is hence improved. In addition, since the metal posts are pre-fabricated, the lengths and the shapes of the metal posts are uniform.

In accordance with some embodiments, a method includes retrieving one of the metal posts from a metal-post storage, wherein the metal posts are pre-fabricated, and bonding the one of the metal posts on a metal pad.

In accordance with other embodiments, a method includes forming a plurality of metal posts. The plurality of metal posts is interconnected to form a metal-post row by weak portions between neighboring ones of the plurality of metal posts. The weak portions comprise a same metal as the plurality of metal posts. A majority of each of the plurality of metal posts is separated from respective neighboring ones of the plurality of metal posts. An end portion of each of the plurality of metal posts is plated with a metal.

In accordance with yet other embodiments, an apparatus includes a metal-post storage configured to store a plurality of metal posts that is interconnected to form a row, and a capillary. The capillary is configured to retrieve a front one of the plurality of metal posts, and bond the front one of the plurality of metal posts on a metal pad.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a plurality of metal posts, wherein the plurality of metal posts is interconnected to form a metal-post row by weak portions between neighboring ones of the plurality of metal posts, wherein the weak portions comprise a same metal as the plurality of metal posts, and wherein a majority of each of the plurality of metal posts is separated from respective neighboring ones of the plurality of metal posts; and
   plating an end portion of each of the plurality of metal posts with a metal;
   disposing the plurality of metal posts in a metal-post storage; and
   retrieving one of the plurality of metal posts from the metal-post storage, wherein the retrieving comprises:
      using a cutting edge of a capillary to cut the one of the plurality of metal posts from the metal-post row;
      pushing the one of the plurality of metal posts to an end of a slot in the capillary; and
      clamping the one of the plurality of metal posts to the end of the slot.

2. The method of claim 1, wherein the step of forming the plurality of metal posts comprises:
   forming patterned photo resists on opposite sides of a metal film; and
   etching the metal film to form the plurality of metal posts.

3. The method of claim 1, wherein the step of forming the plurality of metal posts comprises feeding a metal film through two rollers comprising teeth, wherein the metal film is molded by the rollers to form the plurality of metal posts.

4. The method of claim 3, wherein after passing between the two rollers, a plurality of rows of metal posts is formed from the metal film simultaneously.

5. The method of claim 1 further comprising plating the end portion of each of the plurality of metal posts with a nickel layer and a gold layer over the nickel layer.

6. The method of claim 1 further comprising:
   bonding the one of the plurality of metal posts to a metal pad; and
   repeating the step of retrieving and bonding for remaining ones of the plurality of metal posts.

7. The method of claim 6, wherein the retrieving and the bonding are performed using a same capillary.

\* \* \* \* \*